(12) United States Patent
Ellis

(10) Patent No.: US 6,362,543 B1
(45) Date of Patent: Mar. 26, 2002

(54) MAGNETOSTRICTIVE SURFACE ACOUSTIC WAVE DEVICES WITH TRANSDUCERS TUNED FOR OPTIMAL MAGNETIC ANISOTROPY

(75) Inventor: Kenneth Alexander Ellis, North Plainfield, NJ (US)

(73) Assignee: Agere Systems Optoelectronics Guardian Corp.

( * ) Notice: Subject to any disclaimer, the term of this patent is extended or adjusted under 35 U.S.C. 154(b) by 0 days.

(21) Appl. No.: 09/466,311

(22) Filed: Dec. 17, 1999

(51) Int. Cl.[7] .............................................. H01L 41/08
(52) U.S. Cl. ...................... 310/26; 310/313 R; 333/150
(58) Field of Search ............................... 310/26, 313 R, 310/313 A; 333/150–155, 193–196

(56) References Cited

U.S. PATENT DOCUMENTS 5,239,504 A * 8/1993 Brady et al. ................. 308/157
5,365,770 A * 11/1994 Meitzler et al. ..... 310/313 R X
5,959,388 A * 9/1999 Graebner et al. ....... 310/313 R

* cited by examiner

*Primary Examiner*—Mark O. Budd
(74) *Attorney, Agent, or Firm*—Lowenstein Sandler PC

(57) ABSTRACT

In accordance with the invention, magnetostrictive saw devices are provided with tunable transducer structures for enhanced performance. The transducers are in the form of patterned conductors disposed between magnetic films. The magnetostrictive response is tuned by adjusting the thickness of magnetic film overlying the conductive layer.

5 Claims, 3 Drawing Sheets

MAGNETOSTRICTIVE SURFACE ACOUSTIC WAVE DEVICES WITH TRANSDUCERS TUNED FOR OPTIMAL MAGNETIC ANISOTROPY

FIELD OF THE INVENTION

This invention relates to magnetostrictive surface acoustic wave (SAW) devices and, in particular, to magnetostrictive SAW devices with transducers tuned for optimal magnetic anisotropy and to methods for making such devices.

BACKGROUND OF THE INVENTION

SAW devices are important components in RF circuits, especially in wireless communication devices. SAW devices are particularly important as delay elements. They provide low-velocity, non-dispersive propagation with low attenuation up to microwave frequencies and a propagation path which is accessible at a substrate surface.

While conventional SAW devices are not readily integrated into silicon microelectronic circuits, a magnetostrictive SAW device which can be fabricated on silicon substrates is described in U.S. patent application Ser. No. 09/137,431, filed by Glenn B. Alers et al. on Aug. 21, 1998 and entitled "Magnetostrictive Acoustic Wave Device and Microelectronic Circuit Including Same", which is incorporated herein by reference. These devices can be integrated with microelectronic circuits usefull in wireless communications.

In essence, the magnetostrictive SAW device comprises a substrate, a film of magnetostrictive material disposed on the substrate, an input transducer for generating surface acoustic waves along the film and an output transducer for receiving the acoustic waves. The substrate can comprise silicon and include one or more microelectronic circuit elements interconnected with the magnetostrictive SAW device. The transducers are typically serpentine (meander-type) electrodes.

Magnetostrictive SAW devices with improved transducer structures are described in U.S. patent application Ser. No. 09/464,805 filed concurrently herewith by Glenn B. Alers et al. The application, entitled "Magnetostrictive Surface Acoustic Wave Devices Having Improved Transducers" is incorporated herein by reference and describes, inter alia, improved transducer structures utilizing multiple configured layers. Typically the transducer conductors are disposed on the magnetostrictive film and covered with an overlying film of magnetic material. The overlying film reduces the magnetic reluctance of the magnetic circuit surrounding the conductor, thereby enhancing the magnetostrictive response of the device.

SAW devices exhibit two types of magnetic anisotropy: an intrinsic anisotropy of the magnetostrictive material and a shape anisotropy due to the geometry of the magnetic layers in the device. These combine to form the total anisotropy of the device. A certain amount of anistropy is needed to place the ferromagnetic resonance frequency above the devices operating frequency. This can be achieved through shape or intrinsic anisotropy or both. While a certain level of total anisotropy is needed to achieve the device operating frequency, the higher the total anistropy, the larger the device must be. Accordingly there is a need for SAW devices tuned to the minimum total magnetic anisotropy consistent with their operating frequency.

SUMMARY OF THE INVENTION

In accordance with the invention, magnetostrictive SAW devices are provided with tunable transducer structures for enhanced performance. The transducers are in the form of patterned conductors disposed between magnetic films. The magnetostrictive response is tuned by adjusting the thickness of magnetic film overlying the conductive layer.

BRIEF DESCRIPTION OF THE DRAWINGS

The advantages, nature and various additional features of the invention will appear more fully upon consideration of the illustrative embodiments described in connection with the accompanying drawings. In the drawings.

It should be understood that these drawings are for purposes of illustrating the concepts of the invention and, except for the graph, are not to scale.

DETAILED DESCRIPTION

This disclosure is divided into two parts. Part I describes the structure of magnetostrictive SAW devices which can be tuned in accordance with the invention, and Part II describes methods of tuning.

I. Tunable Magnetostrictive SAW Devices

Figure 1:
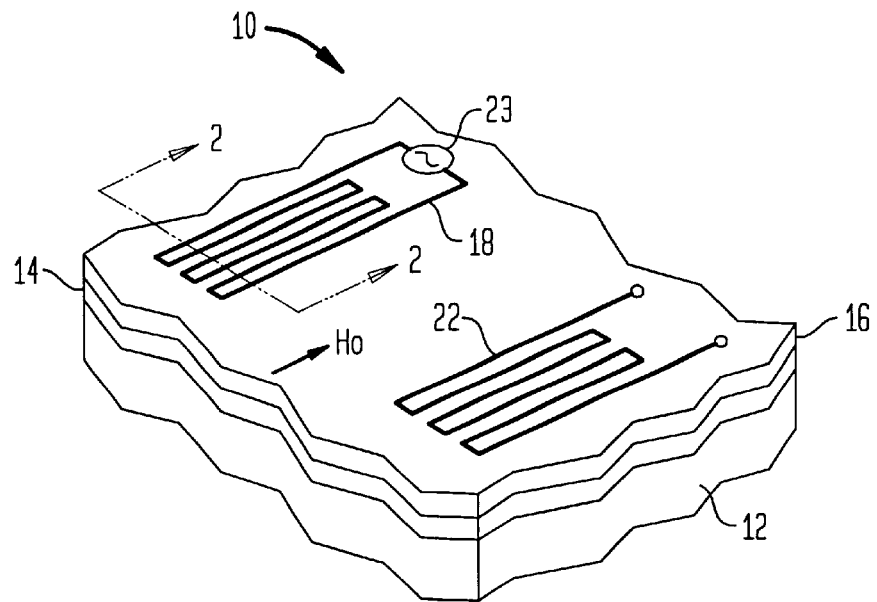
FIG. 1 is a perspective view of a tunable SAW device.

Referring to the drawings, FIG. 1 is a perspective view of a magnetostrictive SAW device 10 comprising a substrate 12 coated with a thin film 14 of magnetostrictive material typically followed by a film 16 of insulating material. An input magnetoelastic transducer 18, typically in serpentine form, is disposed on a first region of insulating film 16 and a similar output transducer 22 is disposed on a second region of film 16 for receiving acoustic waves propagated from input transducer 18. The transducers each comprise patterned layers of conductor and magnetic material. The transducers extend in the direction x of surface wave propagation with periodic discrete excursions perpendicular to the direction of propagation. Alternatively, the transducers 18, 22 can be comb-like grid structures such as the improved transducers described in the aforementioned concurrently filed Alers et al. application.

Application of an oscillatory electrical signal to the ends of input transducer 18 generates horizontally polarized acoustic waves (shear and longitudinal) in thin film 14. These waves are generated by the input transducer 18 through the magnetostrictive effect. They then propagate from input transducer 18, through film 14 and substrate 12, to the second transducer where they produce a corresponding oscillatory electrical signal in output transducer 22.

In typical devices, the thin film 14 of magnetostrictive material has a thickness in the range 0.1–1.0 $\mu$m and the insulating film 16 has a thickness of about 0.1–1.0 $\mu$m. An advantageous magnetostrictive material is $Co_{1-x-y-z}Fe_z Ta_x Zr_y$, with $0.01<x<0.15$ and $0.25<z<0.7$. Other suitable magnetostrictive materials include polycrystalline ferromagnetic alloys such as $Ni_x Fe_{1-x}$, preferably with $0.4<x<0.6$ or $0.15<x<0.25$ and $Co_x Fe_{1-x}$, preferably with $0.3<x<0.7$; amorphous ferromagnetic alloys of Fe and/or Co with early transition metals such as $Co_{1-x-y}Ta_x Zr_y$, preferably with $0.01<x<0.15$ and $0.01<y<0.15$, and $Co_{1-x-y}Nb_x Zr_y$, preferably with $0.01<x<0.15$ and $0.01<y<0.15$; amorphous ferromagnetic alloys of Fe and/or Co with metalloids such as $Fe_{1-x-y}Co_xP_y$, preferably with $0.01<x<0.7$ and $0.05<y<0.2$; and rare-earth transition-metal ferromagnetic alloys such as $Tb_xDy_{1-x}Fe_y$, preferably with $0.2<x<0.3$ and $1.9<y<2.1$. Ferromagnetic oxides, such as $NiFe_2O_4$, $(NiZn)Fe_2O_4$, and $Fe_3O_4$, can also be used for the thin film 14. Since these oxides are insulating, they permit omission of the insulating film 16.

In an advantageous embodiment, the substrate 12 comprises a silicon substrate including at least one microelectronic circuit 23, and the input transducer 18 or the output transducer 12 is coupled to the microeletronic circuit 23. In such arrangements, the SAW device 10 provides non-dispersive, low-loss delay particularly useful in wireless communication circuits.

Figure 2A:
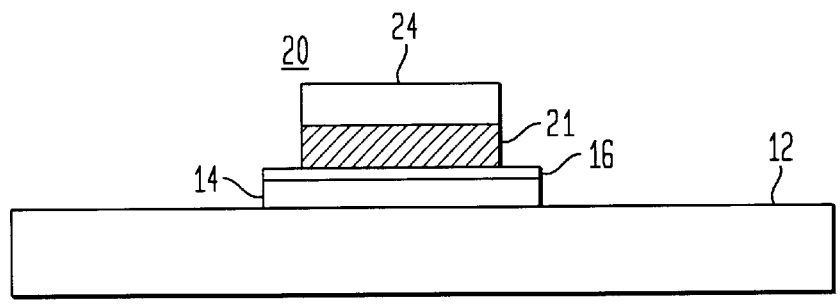
FIGS. 2(a) and 2(b) are schematic cross sections of transducers for the FIG. 1 device.
Figure 2B:
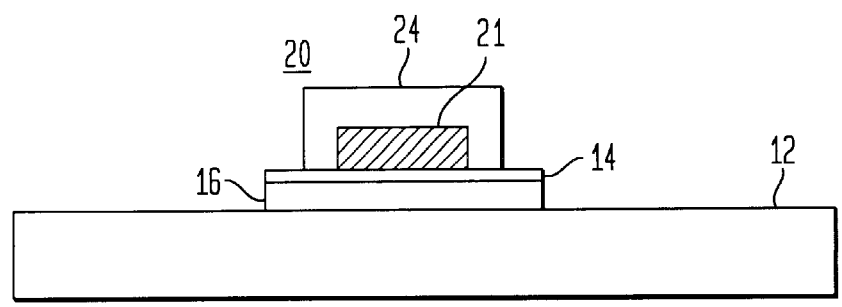

FIGS. 2(*a*) and 2(*b*) are schematic cross sections of transducer structures 20 on substrates 12 utilizing multiple configured layers. Such transducers can be either of serpentine or grid form. In the FIG. 2(*a*) transducer 20, the insulating and magnetostrictive films 16, 14, are patterned in a configuration similar to the configuration of the overlying conductor 21. Not only are the insulating and magnetostrictive films patterned, but also a patterned film of magnetic material 24 overlies the conductor 21. The magnetic film and the transducer conductors can be patterned together using conventional photolithographic techniques. Preferably the electrodes are formed by depositing a film of highly conductive metal such as Cu or Al at a thickness typically in the range 0.1–0.4 μm, depending on the frequency and the desired DC resistance. The film can be patterned to an illustrated shape by wet etching, reactive ion etching or ion milling.

FIG. 2(*b*) is an alternative transducer 20 where the overlying magnetic layer 24 and the magnetostrictive material 14 essentially surround the transducer conductor 21. Here the conductor 21 is patterned first, then the overlying magnetic film 24 is deposited and patterned.

The overlying magnetic layer 24 is advantageously a soft magnetic material having a relatively small uniaxial anisotropy. The anisotropy should be as low as possible consistent with a ferromagnetic resonance frequency above the desired frequency of operation. Alternatively and consistent with the above preferences the overlying magnetic layer 24 can be a magnetostrictive material.

In the embodiments of FIGS. 2(*a*) and 2(*b*), the upper magnetic film 24 reduces the magnetic reluctance of the magnetic circuit surrounding the conductor, thereby increasing the flux level in the magnetostrictive material and thus the magnetostrictive response.

II. Tuning Magnetostrictive SAW Devices

Tuning the magnetic properties of the magnetostrictive SAW device involves balancing the intrinsic anisotropy of the magnetic material with the magnetic shape anisotropy of the device. There are two ways of doing this. The first involves altering the geometry of the device. The second involves controlling the intrinsic magnetic anisotropy. One or both methods can be used during fabrication to obtain a desired total anisotropy. In general, higher signal frequency applications require higher levels of anisotropy, but it is desirable to have the lowest anisotropy consistent with the frequency of operation.

An analytical criterion for tuning can be derived as follows. The ferromagnetic resonance frequency, $f_{FMR}$, of the magnetic material should be greater than the device operating frequency $f_{OP}$. We know that $f_{FMR}$ is given by $$f_{FMR} = \frac{\gamma}{2\pi}\sqrt{4\pi M_S H_K}, \quad\quad (Eq.\ 2)$$

where $\gamma$ is the gyromagnetic ratio, $M_S$ is the saturation magnetization, and $H_K$ is the effective anistropy field of the magnetic material. The requirement $f_{OP}<f_{FMR}$ places a lower effective limit on $H_K$, namely:

$$H_K > \left(\frac{2\pi f_{OP}}{\gamma}\right)^2 \frac{1}{4\pi M_S}. \quad\quad (Eq.\ 3)$$

The device is ideally tuned to provide $H_K$ such that $$1.05 < (f_{FMR}/f_{OP}) < 4. \quad\quad (Eq.\ 4)$$

How close this ratio can be to 1 is determined by the width of the ferromagnetic resonance response, which varies from material to material.

Thus in a tuned device magnetic layer 24 typically differs in thickness from magnetic layer 14 and Eq. 4 is met.

Figure 3A:
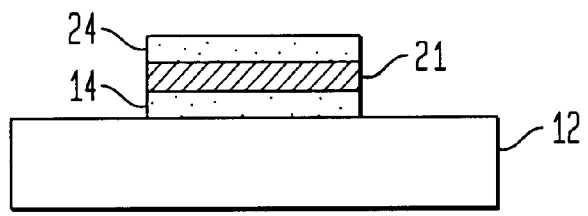
FIGS. 3(a) and 3(b) are schematic cross sections of a transducer tuned in accordance with a first technique.
Figure 3B:
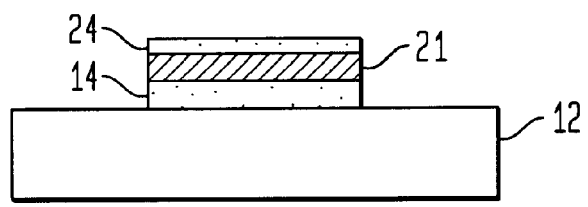
Figure 4A:
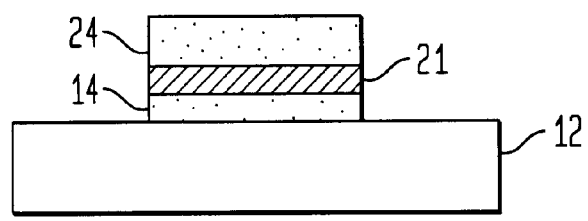
FIGS. 4(a) and 4(b) are schematic cross sections of a transducer tuned in accordance with a second technique.
Figure 4B:
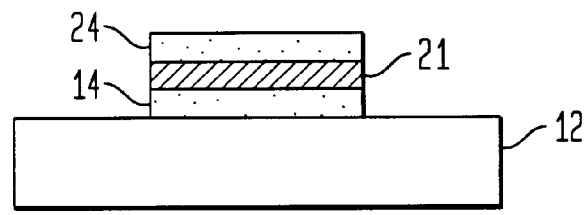

FIGS. 3(*a*) and 3(*b*) illustrate the first method of tuning. FIG. 3(*a*) is a schematic cross section of the untuned transducer comprising a patterned composite layer composed of the magnetostrictive film 14, the conductive layer 21 and the overlying magnetic layer 24. A thin insulating layer (not shown) may or may not intervene between the film 14 and the conductor 21. If the overlying magnetic layer is of different thickness than the bottom magnetic layer, this imbalance leads to greater shape anisotropy.

The FIG. 3(*a*) structure can be tuned by trimming the thickness of the overlying magnetic layer 24, as by etching. Advantageously, the thickness is reduced while the device is being electrically probed to ensure optimal tuning. The trimmed structure is shown in FIG. 3(*b*). This tuning will increase the shape anisotropy and is most useful when large shape anisotropies are required.

A second approach to tuning by trimming is to intentionally grow the overlying magnetic layer 24 thicker than the underlying magnetostrictive layer 14. Then the thicker top layer 24 is trimmed back. As the top layer thickness is reduced, the total anisotropy will pass through a minimum when the top and bottom magnetic layers are perfectly matched in thickness. This method is most useful when small shape anisotropies are required or when the required anisotropy is not expressly known.

Alternatively, if the overlying magnetic layer 24 is thinner than needed for optimal tuning, then additional magnetic material can be grown on layer 24.

The second way to tune the magnetic properties is to control the intrinsic anisotropy of the magnetostrictive material. The technique comprises layering materials with different intrinsic anisotropies to produce a layered structure having an intermediate anisotropy. For proper tuning the total thickness of each magnetic layer should be such that lamellar domains are suppressed. The thickness can be calculated from magnetostatics and will typically be several hundred nanometers. Once the domain walls along the vertical axis are suppressed, the intrinsic anistropies will add in an approximately linear fashion. Thus if a material n with an intrinsic anisotropy $K_{u,n}$ comprises a fraction $f_n$ of the film, the net intrinsic anisotropy of the multilayer is approximately:

$$\sum_{\text{all n}} f_n K_{u,n} \qquad \text{(Eq. 1)}$$

The invention can now be better understood by consideration of the following specific examples:

EXAMPLE 1

Figure 5:
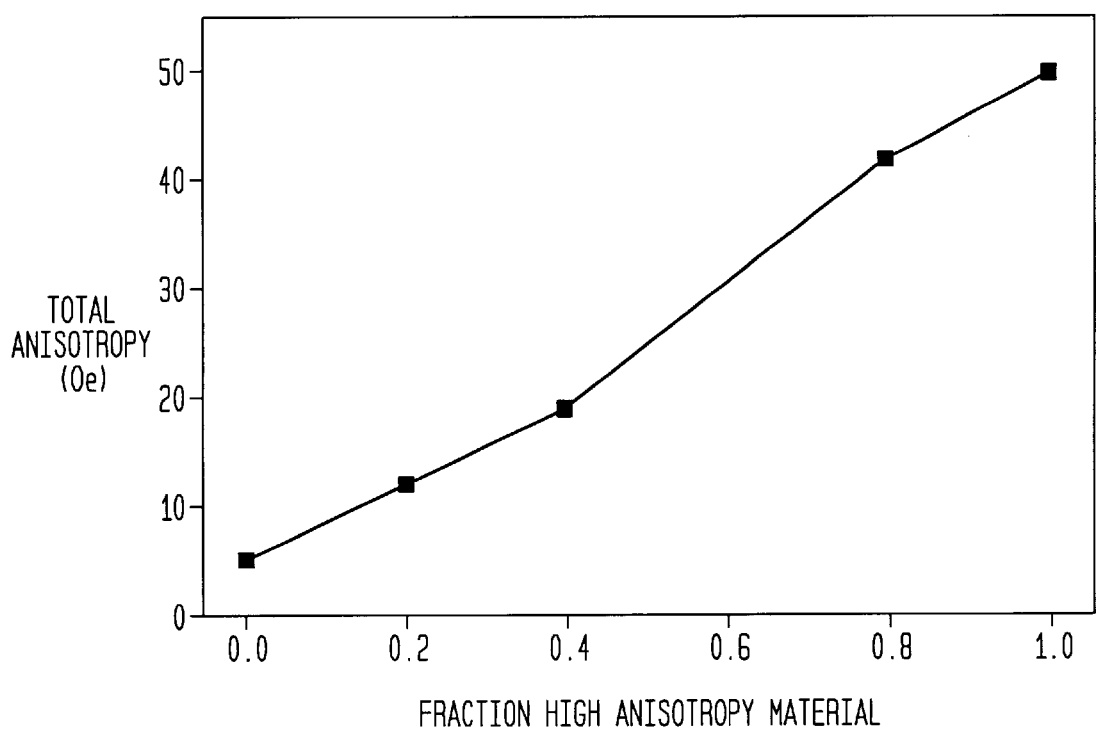
FIG. 5 is a graphical illustration showing the affect of tuning on the total anistropy of the magnetic layers.

This method was confirmed using a Co—Fe—Ta—Zr (46%-46%-5%-3% atomic concentration) alloy (hereafter abbreviated CFTZ). The low intrinsic anisotropy form of CFTZ, with an anisotropy of 5 Oe, was fabricated by rotating the substrate during deposition, with a stationary magnetic field applied to the substrate. The high intrinsic anisotropy form of CFTZ, with an anisotropy of 50 Oe, was fabricated in a similar fashion, but with the substrate held stationary. In FIG. 5, the total anisotropy of bilayers is plotted, as a function of fraction of high anisotropy material. Here the anisotropy is characterized as an anisotropy field, $H_k = K_u/2M_s$. The dependence is approximately linear, as expected.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed:

1. In a magnetostrictive surface acoustic wave device for operation at a frequency $f_{OP}$ comprising a substrate, a layer of magnetostrictive material, an input transducer coupled to the layer for generating surface acoustic waves along the layer and an output transducer for receiving the acoustic waves, each transducer comprising a patterned composite of a conductive layer disposed over the magnetostrictive layer and a magnetic layer overlying the conductive layer, the device having a ferromagnetic resonance frequency $f_{FMR}$, the improvement wherein the thickness of the overlying magnetic layer is adjusted to provide the ratio $f_{FMR}/f_{OP}$ in the range 1.05 to 4.0.

2. The improved device of claim 1 wherein the substrate comprises silicon.

3. The improved device of claim 2 wherein the substrate comprises at least one microcircuit.

4. The improved device of claim 1 wherein the magnetostrictive layer comprises a ferromagnetic alloy.

5. The improved device of claim 1 wherein the overlying magnetic layer comprises a soft magnetic material having uniaxial anisotropy.

\* \* \* \* \*